(12) United States Patent
Fee et al.

(10) Patent No.: US 7,700,406 B2
(45) Date of Patent: Apr. 20, 2010

(54) METHODS OF ASSEMBLING INTEGRATED CIRCUIT PACKAGES

(75) Inventors: Setho Sing Fee, Singapore (SG); Lim Thiam Chye, Singapore (SG); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 210 days.

(21) Appl. No.: 11/770,451

(22) Filed: Jun. 28, 2007

(65) Prior Publication Data

US 2008/0284000 A1 Nov. 20, 2008

(30) Foreign Application Priority Data

May 17, 2007 (SG) .............................. 200703582-7

(51) Int. Cl.
  H01L 21/50 (2006.01)
  H01L 21/48 (2006.01)
  H01L 21/66 (2006.01)
  H01L 21/44 (2006.01)

(52) U.S. Cl. .................. 438/106; 438/15; 438/107; 438/108; 438/118; 438/119; 438/120; 438/612; 257/E21.508; 257/E21.509

(58) Field of Classification Search .......... 257/E21.508, 257/E21.509
See application file for complete search history.

(56) References Cited

U.S. PATENT DOCUMENTS

| 5,804,876 | A | | 9/1998 | Lake et al. |
| 6,107,109 | A | * | 8/2000 | Akram et al. ................. 438/15 |
| 6,114,239 | A | | 9/2000 | Lake et al. |
| 6,506,672 | B1 | | 1/2003 | Dagenais et al. |

(Continued)

FOREIGN PATENT DOCUMENTS

DE 10343180 A1 4/2005

(Continued)

OTHER PUBLICATIONS

Jihye Lee, Jung H. Kim, and Choong D. Yoo, "Thermosonic Bonding of Lead-Free Solder with Metal Bump for Flip-Chip Bonding", accepted (Aug. 18, 2004), Springer Boston, vol. 34, No. 1, 2005, pp. 96-102.*

(Continued)

Primary Examiner—Charles D Garber
Assistant Examiner—Mohsen Ahmadi
(74) Attorney, Agent, or Firm—Wells St. John P.S.

(57) ABSTRACT

Some embodiments include methods of assembling integrated circuit packages in which at least two different conductive layers are formed over a bond pad region of a semiconductor die, and in which a conductive projection associated with an interposer is bonded through a gold ball to an outermost of the at least two conductive layers. The conductive layers may comprise one or more of silver, gold, copper, chromium, nickel, palladium, platinum, tantalum, titanium, vanadium and tungsten. In some embodiments, the bond pad region may comprise aluminum, an inner of the conductive layers may comprise nickel, an outer of the conductive layers may comprise gold, the conductive projection associated with the interposer may comprise gold; and the thermosonic bonding may comprise gold-to-gold bonding of the interposer projection to a gold ball, and gold-to-gold bonding of the outer conductive layer to the gold ball. Some embodiments include integrated circuit packages.

7 Claims, 6 Drawing Sheets

U.S. PATENT DOCUMENTS

| | | | |
|---|---|---|---|
| 6,556,030 B1 | 4/2003 | Akram | |
| 7,112,471 B2 | 9/2006 | Boon et al. | |
| 7,427,557 B2* | 9/2008 | Rinne et al. | 438/612 |
| 2003/0094481 A1 | 5/2003 | Horie et al. | |
| 2003/0127747 A1 | 7/2003 | Kajiwara et al. | |
| 2003/0139004 A1 | 7/2003 | Yoshida | |
| 2004/0035840 A1* | 2/2004 | Koopmans | 219/209 |
| 2004/0126928 A1* | 7/2004 | Kinsman et al. | 438/108 |
| 2004/0152292 A1 | 8/2004 | Babinetz et al. | |
| 2004/0164421 A1* | 8/2004 | Tellkamp | 257/772 |
| 2004/0229425 A1 | 11/2004 | Yamaguchi et al. | |
| 2005/0017372 A1* | 1/2005 | Lua et al. | 257/778 |
| 2005/0151268 A1* | 7/2005 | Boyd et al. | 257/778 |
| 2005/0236709 A1* | 10/2005 | Eng et al. | 257/737 |
| 2006/0012024 A1 | 1/2006 | Lin et al. | |
| 2006/0014316 A1 | 1/2006 | Lin et al. | |
| 2006/0092079 A1* | 5/2006 | de Rochemont | 343/700 MS |
| 2006/0228825 A1 | 10/2006 | Hembree | |
| 2006/0261446 A1 | 11/2006 | Wood et al. | |
| 2007/0013067 A1 | 1/2007 | Nishida et al. | |
| 2007/0020814 A1* | 1/2007 | Hembree et al. | 438/124 |
| 2008/0308931 A1* | 12/2008 | Rinne et al. | 257/737 |

FOREIGN PATENT DOCUMENTS

| | | |
|---|---|---|
| GB | 2284928 | 6/1995 |
| WO | WO/2006/110266 | 10/2006 |
| WO | WO/2006/124295 | 11/2006 |

OTHER PUBLICATIONS

US2008061169, PC, Aug. 13, 2008, PCT Search Report.
US2008061169, PC, Aug. 13, 2008, PCT Written Opinion.
Cheah, L.K., et al. "Thermosonic Flip Chip Assembly" Flip Chips Dot Com, Tutorial 9—June 2007; reprinted Feb. 18, 2007; 7 pages.
Flip-Chip Assembly; http://www.siliconfareast.com/flipchipassy.htm; reprinted Feb. 16, 2007 2 pages.
Riley, George A "Introduction to Flip Chip: What, Why How". Flip Chips Dot Com, Tutorial 1—Oct. 2000 5 pages.
Riley, George A. "Under Bump Metallization (UBM)" Flip Chips Dot Com, Tutorial 11—Sep. 2001; reprinted Feb. 16, 2007; 3 pages.
Riley, George A. "Electroless Nickel-Gold Flip Chip" Flip Chips Dot Com, Tutorial 7—Apr. 2001; reprinted Feb. 16, 2007; 4 pages.
Riley, George A. "Stud Bump Flip Chip" Flip Chips Dot Com, Tutorial 3—December 2000; 5 pages.
Roth Laurie, S. et al. "Stud Bump Bonding:" http://ap.pennet.com/Article/Article_Display.cfm reprinted Feb. 13, 2007 6 pages.

* cited by examiner

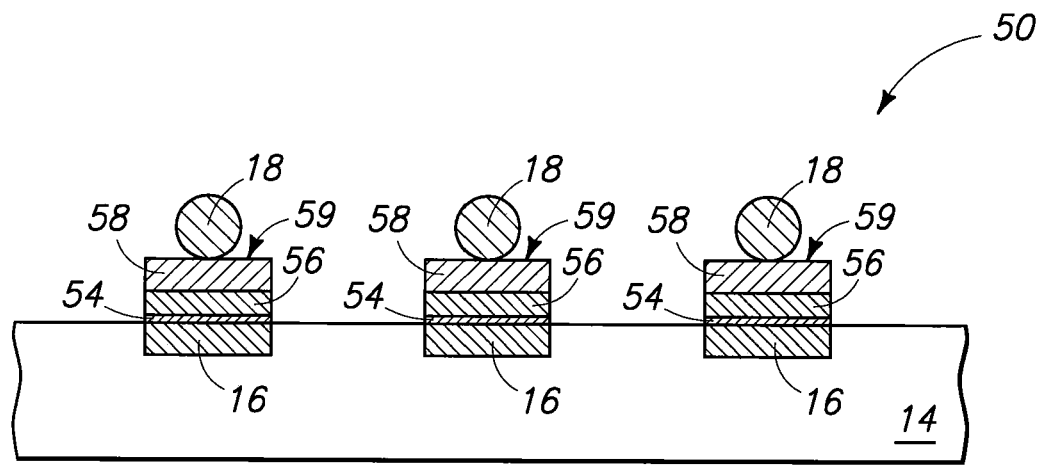
_Fig. 8_
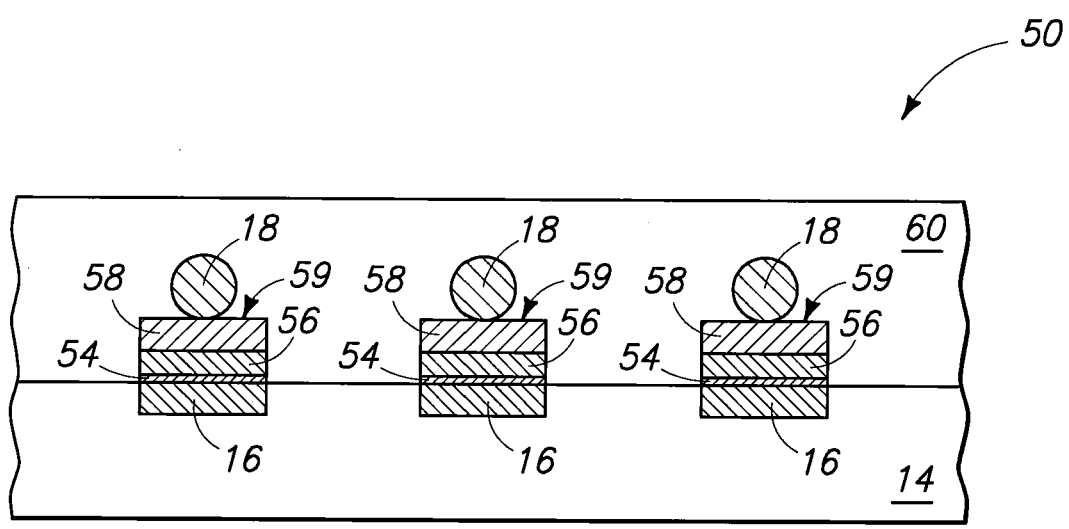
_Fig. 9_

METHODS OF ASSEMBLING INTEGRATED CIRCUIT PACKAGES

RELATED PATENT DATA

This patent claims priority to Singapore Patent Application No. 200703582-7, which was filed May 17, 2007, and which is titled "INTEGRATED CIRCUIT PACKAGES, METHODS OF FORMING INTEGRATED CIRCUIT PACKAGES, AND METHODS OF ASSEMBLING INTEGRATED CIRCUIT PACKAGES".

TECHNICAL FIELD

Integrated circuit packages, methods of forming integrated circuit packages, and methods of assembling integrated circuit packages.

BACKGROUND

Integrated circuit packages may be formed as flip chip assemblies. Specifically, a semiconductor die may be bonded face-down ("flipped") onto an interposer. An example prior art process for forming a flip chip assembly is described with reference to FIGS. 1 and 2.

FIG. 1 shows a semiconductor die 10 in face-down orientation, and shows an interposer 12 beneath the die.

The semiconductor die 10 comprises a base 14 supporting a plurality of bond pad regions 16. The base 14 may comprise a semiconductor material (for instance, monocrystalline silicon) supporting any of numerous integrated circuit components, including, for example, memory components, logic components, sensor components, wiring, etc. The various components are not shown in order to simplify the drawing.

Bond pad regions 16 provide electrical connection from integrated circuit components associated with base 14 to circuitry external of the base. The bond pad regions may comprise, consist essentially of, or consist of aluminum or copper. The bond pad regions are shown to have outer surfaces 17, and electrical interconnect material 18 is shown bonded to such outer surfaces. The electrical interconnect material may comprise, consist essentially of, or consist of gold, and may be balls (as shown) bonded to the bond pad regions, or may be pieces of wire bonded to the bond pad regions.

The bond pad regions 16 may be distributed in numerous orientations across a surface of die 10. For example, the bond pad regions may be so-called inner bond pad regions along a central portion of the die surface, may be so-called outer bond pad regions along non-central portions of the die surface and connected to the inner bond pad regions by redistribution layers, or may be a combination of inner bond pad regions and outer bond pad regions.

Interposer 12 comprises a board 20 and electrical interconnects 22 supported on an upper surface of the board. The interposer also comprises electrical interconnects 24 supported on a lower surface of the board. Various wiring (not shown) may extend through the board to connect various electrical interconnects 22 with various electrical interconnects 24. The electrical interconnects 22 are ultimately bonded to semiconductor die 10 to form an integrated circuit package comprising the die and interposer, and the electrical interconnects 24 are ultimately utilized for electrical connection of the package to other circuitry.

Electrical interconnects 22 may comprise, consist essentially of, or consist of gold. Electrical interconnects 24 may comprise any suitable electrically conductive materials or combinations of materials, and may, for example, comprise materials suitable for bonding to solder.

FIG. 2 shows the interposer 12 bonded to the semiconductor die 10. The bonding may comprise gold-to-gold bonding between gold-containing interconnects 22 and gold-containing interconnects 18. The gold-to-gold bonding is accomplished by pressing interconnects 18 and 22 together while subjecting the interconnects to ultrasonic energy and thermal energy (so-called thermosonic bonding). An underfill 30 is provided in a gap between die 10 and interposer 12. The underfill may comprise a film or paste, and may, for example, comprise non-conductive paste (NCP), anisotropic conductive paste (ACP), anisotropic conductive film (ACF) or organic solderability preservative (OSP).

A problem that can occur is that the bonding between interconnects 18 and 22 may subject bond pad regions 16 to sufficient pressure to cause cracking 32 (only some of which is labeled in FIG. 2) or other defects within the bond pad regions. Another problem that may occur is that the thermosonic energy of the thermosonic bonding may cause cratering or other defects in the bond pad regions. Yet another problem that may occur is that the bonding of interconnects 18 to the bond pad regions 16 to form the semiconductor die construction of FIG. 1 may induce defects within regions 16.

It is desired to develop new methods for assembling integrated circuit packages which avoid some or all of the above-described problems.

BRIEF DESCRIPTION OF THE DRAWINGS

FIGS. 3-9 illustrates a process for preparing a semiconductor die for assembly into an integrated circuit package.

DETAILED DESCRIPTION OF THE ILLUSTRATED EMBODIMENTS

Some embodiments include methods of providing materials across bond pads to protect the pads during subsequent thermosonic bonding. Such materials may prevent, or at least substantially reduce, one or more of the problems discussed above in the "Background" section of this disclosure. An example embodiment for forming an integrated circuit package is described with reference to FIGS. 3-11.

Figure 1:
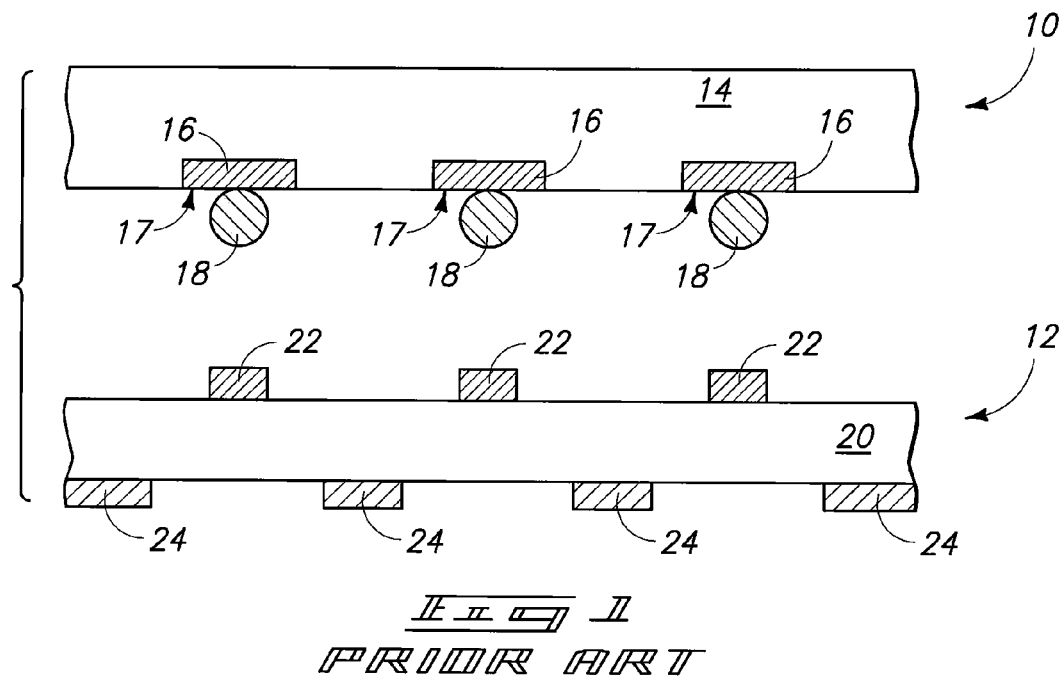
FIG. 1 is a view of a semiconductor die and interposer at a stage of a prior art process for assembling an integrated circuit package.
Figure 3:
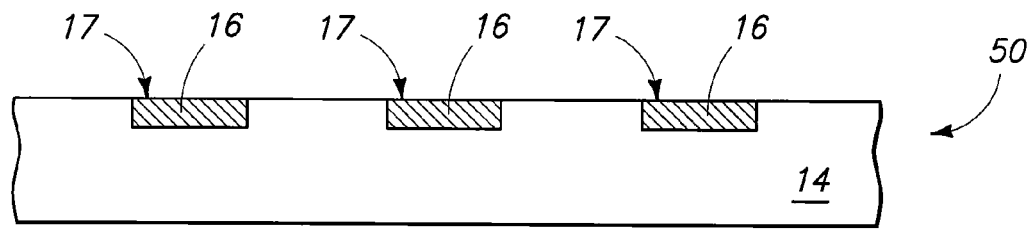

Referring initially to FIG. 3, such illustrates a semiconductor die 50 comprising the base 14 and bond pad regions 16 discussed above with reference to the prior art semiconductor die 10 of FIG. 1. The base may, as discussed above regarding FIG. 1, comprise integrated circuitry containing memory, logic, sensors, etc.

The bond pad regions 16 are shown to have outermost surfaces 17. In some embodiments, the bond pad regions may comprise, consist essentially of, or consist of aluminum or copper; and accordingly the outermost surfaces may comprise, consist essentially of, or consist of aluminum or copper. If the bond pad regions contain aluminum, a thin oxide of aluminum (not shown) may extend across the uppermost surfaces 17 at the processing stage of FIG. 3.

Figure 4:
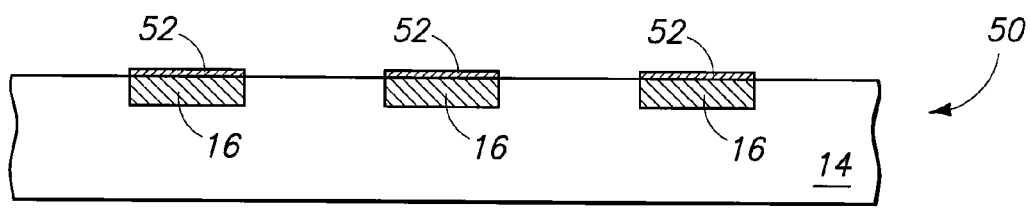
Figure 5:
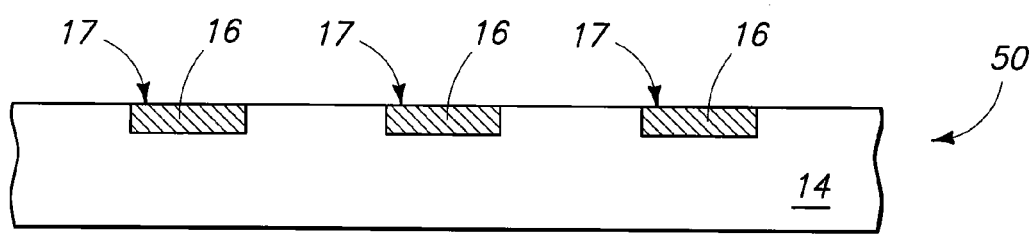

Referring to FIG. 4, zinc-containing layers 52 are formed over bond pad regions 16. The zinc-containing layers may be formed by first cleaning the bond pad regions with acid (for example, one or both of sulfuric acid and hydrofluoric acid) and/or base (for example, sodium hydroxide). Such cleaning forms a fresh surface for deposition of zinc, and may remove oxide. Subsequently, the surface may be exposed to zincate (in other words, to a zinc-containing solution, which may be, for example, cyanide-based, acid-based or alkaline-based) to deposit thin layers of zinc (which may be monolayers) across the surfaces of the bond pad regions. In some embodiments, the layers of zinc initially formed across the bond pad region surfaces may have relatively large grain sizes, and may be utilized as sacrificial layers to prepare the surfaces for subsequent deposition of zinc-containing layers with a smaller grain sizes. Accordingly, the first zinc-containing layers may be removed with an acid (for example, nitric acid) to again expose surfaces 17 of bond pad regions 16 (FIG. 5), and then second zinc-containing layers 54 (FIG. 6) may be formed by another exposure of the bond pad region surfaces to zincate.

Figure 6:
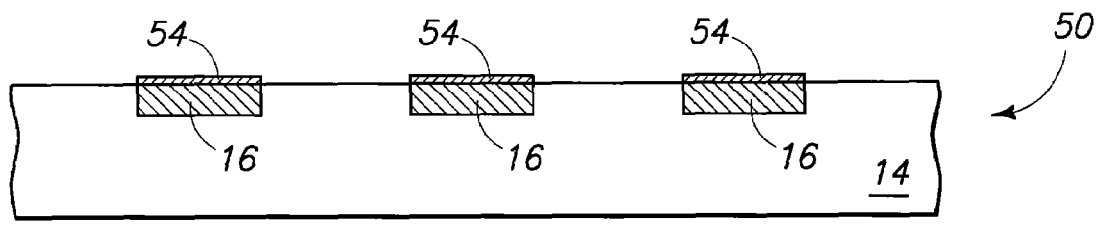

The zinc-containing layers 54 are formed directly against the conductive material (for example, aluminum or copper) of the bond pad regions in the shown embodiment of FIG. 6. Zinc-containing layers 54 may be considered examples of adhesion layers for adhering subsequently-formed layers (for instance, the layers 56 discussed below with reference to FIG. 7) to the bond pad regions. The zinc-containing layers are examples of adhesion layers, and other materials may be utilized for adhesion layers in other embodiments. For instance, zinc-containing layers work well for aluminum-containing surfaces, but may not work satisfactorily for copper-containing surfaces. Accordingly, palladium-containing adhesion layers may be utilized when the bond pad regions comprise copper. In other embodiments, the bond pad regions may comprise materials other than copper or aluminum, and the adhesion layers may comprises materials other than, or in addition to, one or both of zinc and palladium.

Figure 7:
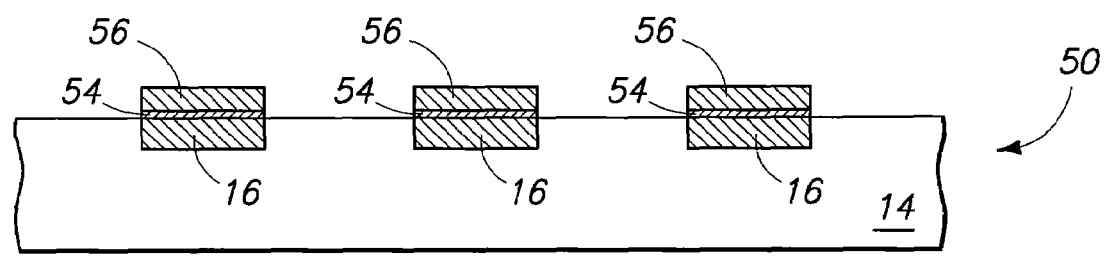

Referring next to FIG. 7, metal-containing layers 56 are formed over and directly against the adhesion layers 54. The metal-containing layers may comprise one or more of Co, Cr, Ni, Pt, Ta, Ti, V and W; and may be doped with one or both of boron and phosphorous. For instance, layers 56 may comprise nickel deposited utilizing electroless deposition methodology. In some embodiments, layers 56 may consist essentially of, or consist of such nickel; and in other embodiments layers 56 may consist essentially of, or consist of such nickel doped with phosphorous (the phosphorus may be present at a concentration of from about 7 atomic percent to about 11 atomic percent).

Referring to FIG. 8, electrically conductive layers 58 are formed over and directly against electrically conductive layers 56, and balls 18 are formed directly against the conductive layers 58. The electrically conductive layers 58 may, for example, comprise, consist essentially of, or consist of one or more of Ag, Au, Cu and Pd. Such materials may be formed by immersion methodologies, and may be doped with phosphorous or boron. For instance, the layers 58 may comprise Pd doped with phosphorous to a phosphorous concentration of from about 7 atomic percent to about 11 atomic percent. In particular embodiments, layers 56 may comprise, consist essentially of, or consist of nickel or nickel doped with phosphorus; and layers 58 may comprise, consist essentially of, or consist of gold. The layers 56 and 58 may together comprise a thickness of from about 0.1 micron to about 10 microns.

The balls 18 utilized in FIG. 8 may comprise any of various electrically conductive materials, including, for example, copper or gold. The balls may thus comprise conventional compositions of the type described in the "Background" section of this disclosure, or may comprise non-conventional compositions. In some embodiments, the balls will not comprise solder, and specifically will not comprise indium or tin.

Layers 54, 56 and 58 form electrically conductive stacks over bond pad regions 16. The stacks extend across the entire upper surfaces of the bond pad regions, and may be considered protective electrically conductive caps formed across the bond pad regions. Although such electrically conductive caps are shown to comprise only the three layers 54, 56 and 58 in the embodiment of FIGS. 3-8, in other embodiments one or more additional layers may be inserted between adhesion layer 54 and conductive layer 56, and/or between conductive layer 56 and conductive layer 58. For instance, the conductive stacks may comprise Ni/Pd/Au (with layers 56 and 58 being Ni and Au, respectively, and the layer of Pd being provided between them).

Since conductive layers 58 are outward of conductive layers 56 relative to bond pad regions 16; the layers 56 may be referred to as inner conductive layers, and the layers 58 as outer conductive layers, in some embodiments.

The layers 58 are shown to comprise outermost surfaces 59. Balls 18 are bonded to the outermost surfaces 59 of layers 58. The bonding of the balls to layers 58 may be accomplished with any suitable methodology, such as, for example, thermosonic bonding. Balls 18 may comprise, consist essentially of, or consist of copper or gold; and in some embodiments the outermost surfaces 59 may comprise, consist essentially of, or consist of copper or gold.

Referring to FIG. 9, deformable material 60 is formed across base 14, across balls 18, and across surfaces 59 of layers 58. Deformable material 60 is ultimately utilized as an underfill material of a flip chip construction comprising semiconductor die 50, and may, for example, comprise one or more of a non-conductive film, non-conductive paste, anisotropically conductive film (so-called z-axis film), anisotropically conductive paste (so-called z-axis paste), and organic solderability preservative (OSP).

Figure 2:
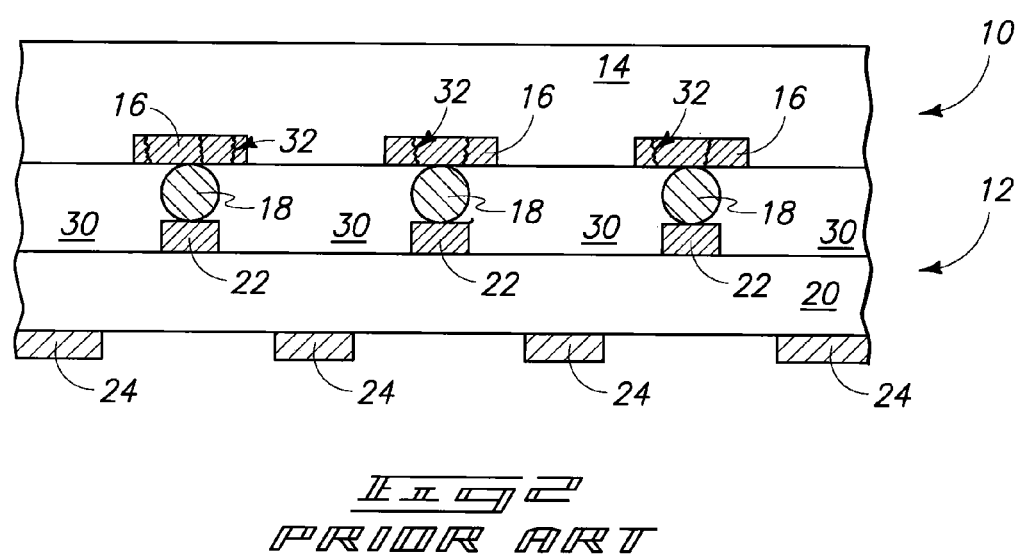
FIG. 2 is a view of the semiconductor die and interposer of FIG. 1 shown at a prior art processing stage subsequent to that of FIG. 1.
Figure 10:
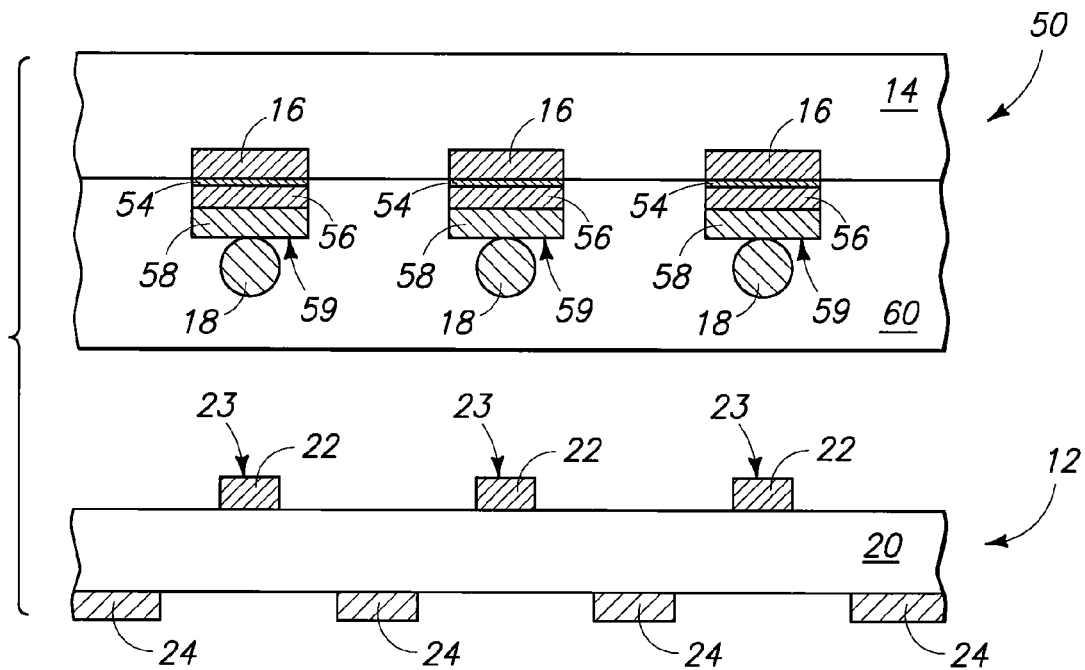
FIGS. 10 and 11 illustrate a process for assembling an integrated circuit package comprising the semiconductor die of FIGS. 3-9 and an interposer.

Referring to FIG. 10, semiconductor die 50 is inverted and provided proximate another structure separate from the die, with such other structure corresponding to an interposer 12 of the type described above with reference to prior art FIGS. 1 and 2. The interposer comprises the base 20 and interconnects 22 and 24 described above. The interconnects 22 may comprise, consist essentially of, or consist of copper, silver, palladium or gold; and comprise outer conductive surfaces 23. The interconnects 22 may be considered to correspond to electrically conductive projections or bumps in some embodiments.

Although die 50 is shown inverted in the embodiment of FIG. 10, in other embodiments die 50 may remain in the orientation of FIG. 9 and interposer 12 may be inverted. Also, although underfill 60 is shown formed across a surface of the die, in other embodiments some or all of the underfill may be formed across surfaces associated with interposer 12 at the processing stage of FIG. 10. For instance, if material 60 comprises OSP, such may be provided across outermost surfaces of interconnects 22 at the processing stage of FIG. 10. In yet other embodiments, the underfill may be omitted, or provided at a processing stage subsequent to that of FIG. 10.

Although balls 18 are shown bonded to conductive layers 58, in other embodiments the balls may be instead bonded to the interposer at the processing stage of FIG. 10.

Figure 11:
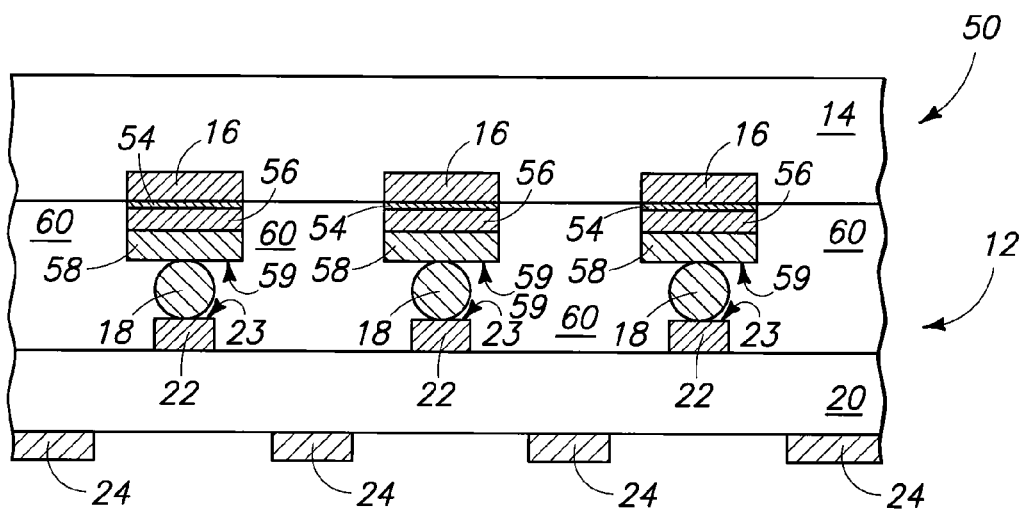

Referring to FIG. 11, surfaces 23 of interposer 12 are pressed through deformable material 60 to directly contact balls 18. Once surfaces 23 and balls 18 are in contact, interconnects 22 may be bonded to the balls utilizing vibrational and/or thermal energy. The vibrational energy may be provided to comprise a frequency of at least about one kilohertz, and the thermal energy may correspond to a temperature of at least about room temperature. In some embodiments, the bonding may comprise thermosonic bonding at a temperature of from about room temperature (about 22° C.) to about 300° C. (for example, from about room temperature to about 200° C.); and with a vibrational energy having a frequency of from about one kilohertz to about 240 kilohertz (for example, a frequency of from about 40 kilohertz to about 100 kilohertz, such as a frequency of about 60 kilohertz); and for a time of less than about five seconds (for example, for a time of about three seconds). In embodiments in which balls 18 initially contact surfaces 23 of projections 22 (in other words, contact surfaces 23 at the processing stage of FIG. 10 instead of contacting surfaces 59 of layers 58), the bonding may be accomplished with the same combination of vibrational and/or thermal energy discussed above, but will bond the balls to surfaces 59. In other embodiments, balls 18 may be omitted, and the vibrational and/or thermal energy may be utilized to directly bond surfaces 23 of projections 22 to surfaces 59 of layers 58.

Figure 12:
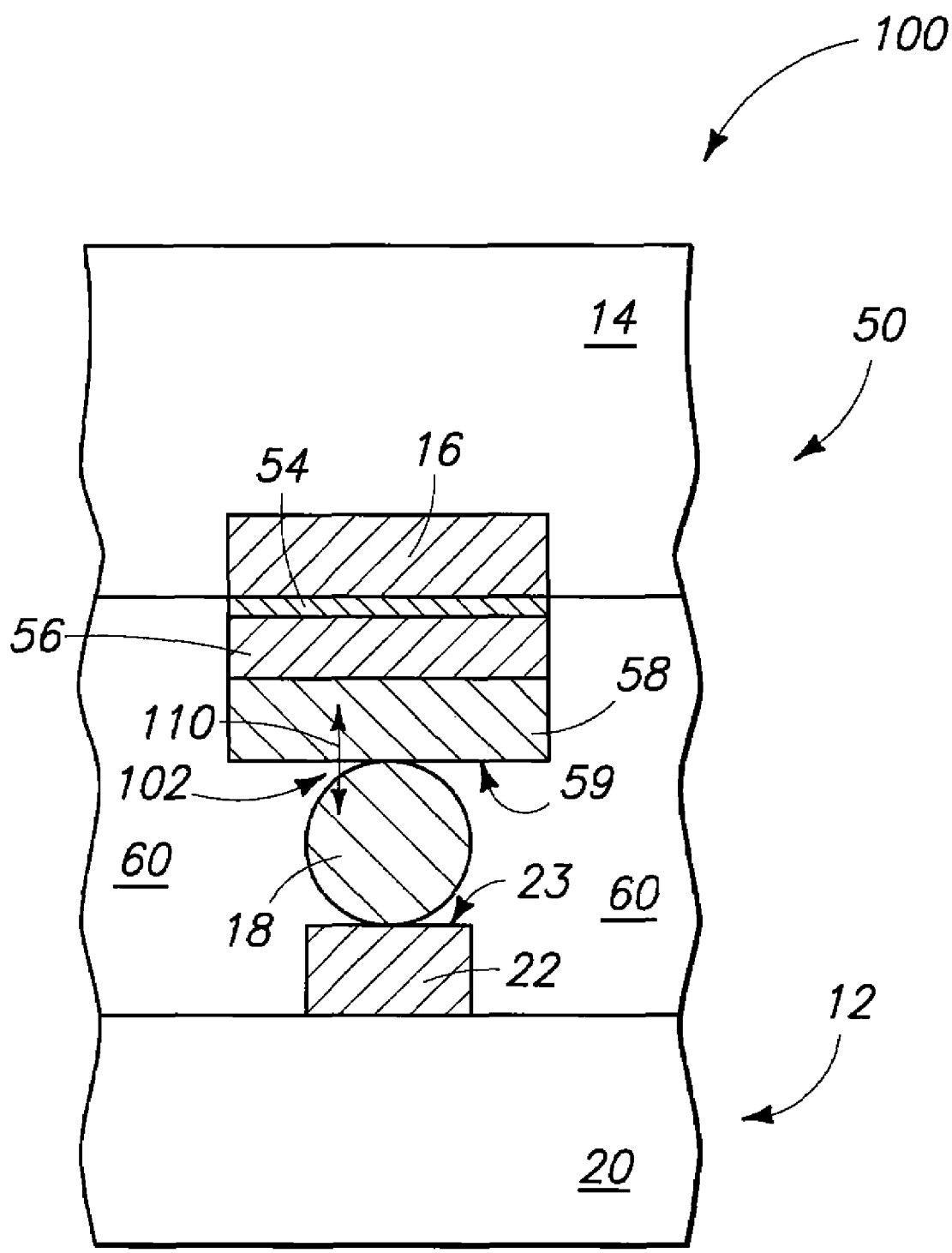
FIG. 12 shows a portion of an integrated circuit package comprising a bond between a bond pad region and an interconnect of an interposer in accordance with an embodiment.

FIG. 11 shows surface 23 of interconnect 22 being planar, surface 59 of outer conductive layer 58 also being planar, and balls 18 being bonded to the planar surfaces. Such leaves gaps adjacent locations where the balls contact the planar surfaces, as shown in FIG. 12. Specifically, FIG. 12 shows a portion of an integrated circuit package 100 comprising the various structures and layers described above with reference to FIGS. 3-11, but comprising a gap 102 identified between a surface of a ball 18 and a portion of surface 59 of outer conductive layer 58. In some embodiments, it can be advantageous to utilize z-axis conductive material (for example, anisotropically conductive film or paste) within underfill 60 so that the material 60 compressed between the surfaces of the ball and outer conductive layer 58 within gap 102 becomes conductive along the axis of compression (in other words, along a shown axis 110 extending within the gap between surface 59 and the ball). The conductivity of material 60 within the gap may then provide improved electrical connection between conductive layer 58 and interconnect 22 relative to that which would occur in the absence of conductivity of material 60. Gaps similar to gap 52 are along all locations where planar surfaces 23 and 59 join to balls 18.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of assembling an integrated circuit package, comprising:
    providing a semiconductor die having integrated circuitry associated therewith, the die comprising electrically conductive bond pad regions and electrically conductive caps over the bond pad regions, the electrically conductive caps being along a top surface of the die and including at least two different conductive layers, one of the at least two different conductive layers being an inner layer and the other being an outer layer; the electrically conductive caps having first planar outer surfaces along the outer layer;
    providing an interposer having electrically conductive projections associated therewith; the projections having second planar outer surfaces;
    bonding balls directly to the first planar outer surfaces of the electrically conductive caps utilizing vibrational energy having a frequency of at least about one kilohertz;
    after bonding the balls to the first planar outer surfaces of the electrically conductive caps, providing z-axis conductive material over the balls; the z-axis conductive material having a substantially planar upper surface that extends across the balls and that extends across regions of the semiconductor die between the balls; the z-axis conductive material entirely surrounding exposed surfaces of the balls: the z-axis conductive material being in a non-conductive form as the z-axis conductive material is provided over and between the
    after providing the z-axis conductive material, pressing the projections of the interposer through the z-axis conductive material until the projections directly contact the balls;
    after the projections are pressed through the z-axis conductive material, the z-axis conductive material filling gaps between curved regions of the balls and the first and second planar outer surfaces, and the z-axis conductive material being compressed in said gaps so that the z-axis conductive material becomes electrically conductive within the gaps to impose conductivity across said gaps; and
    utilizing vibrational energy having a frequency of at least about one kilohertz to bond the balls directly to the second planar outer surfaces of the electrically conductive projections while compressing the z-axis conductive material within said gaps.

2. The method of claim 1 wherein the balls comprise copper.

3. The method of claim 1 wherein the balls comprise gold.

4. The method of claim 1 wherein the electrically conductive bond pad regions comprise one or both of Al and Cu; and wherein one or more of the at least two different conductive layers of the electrically conductive caps include one or more of Ag, Au, B, Co, Cr, Ni, P, Pd, Pt, Ta, Ti, V and W.

5. The method of claim 1 wherein the electrically conductive bond pad regions comprise aluminum.

6. The method of claim 5 wherein the inner layer comprises nickel and the outer layer comprises gold.

7. A method of assembling an integrated circuit package, comprising:
    providing a semiconductor die having integrated circuitry associated therewith, the die comprising electrically conductive bond pad regions and electrically conductive caps over the bond pad regions; the electrically conductive caps having first planar outer surfaces;
    providing an interposer having electrically conductive projections associated therewith; the projections having second planar outer surfaces;
    bonding balls directly to the first planar outer surfaces of the electrically conductive caps;
    after bonding the balls to the first planar outer surfaces of the electrically conductive caps, providing underfill material over and between the balls; the underfill material entirely surrounding exposed surfaces of the balls; the underfill material having a substantially planar upper surface that extends across the balls and that extends across regions of the semiconductor die between the balls;

after providing the underfill material, pressing the projections of the interposer through the underfill material until the projections directly contact the balls;

the underfill being z-axis conductive material; the projections compressing the z-axis conductive material within gaps between curved regions of the balls and the first and second planar outer surfaces to convert the z-axis conductive material within said gaps from a non-conductive form to an electrically conductive form and to thereby impose conductivity across said gaps; and utilizing vibrational energy having a frequency of at least about one kilohertz to bond the balls directly to the second planar outer surfaces of the electrically conductive projections while compressing the z-axis conductive material within said gaps.

* * * * *

UNITED STATES PATENT AND TRADEMARK OFFICE
CERTIFICATE OF CORRECTION

PATENT NO. : 7,700,406 B2 Page 1 of 1
APPLICATION NO. : 11/770451
DATED : April 20, 2010
INVENTOR(S) : Setho Sing Fee et al.

It is certified that error appears in the above-identified patent and that said Letters Patent is hereby corrected as shown below:

In column 6, line 18, in Claim 1, delete "balls:" and insert -- balls; --, therefor.

In column 6, line 20, in Claim 1, after "between the" insert -- balls; --.

Signed and Sealed this

Fifteenth Day of June, 2010

David J. Kappos
*Director of the United States Patent and Trademark Office*